United States Patent
Kim et al.

(10) Patent No.: US 12,457,904 B2
(45) Date of Patent: Oct. 28, 2025

(54) METHODS OF MANUFACTURING MAGNETORESISTIVE RANDOM ACCESS MEMORY DEVICE

(71) Applicant: SAMSUNG ELECTRONICS CO., LTD., Suwon-si (KR)

(72) Inventors: Minkwan Kim, Seoul (KR); Daeeun Jeong, Yongin-si (KR); Kyungtae Nam, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 694 days.

(21) Appl. No.: 17/696,968

(22) Filed: Mar. 17, 2022

(65) Prior Publication Data

US 2023/0023774 A1 Jan. 26, 2023

(30) Foreign Application Priority Data

Jul. 20, 2021 (KR) .................. 10-2021-0094661

(51) Int. Cl.
*H10N 50/01* (2023.01)
*H10B 61/00* (2023.01)
*H10N 50/10* (2023.01)
*H10N 50/80* (2023.01)

(52) U.S. Cl.
CPC ............ *H10N 50/01* (2023.02); *H10B 61/00* (2023.02); *H10N 50/10* (2023.02); *H10N 50/80* (2023.02)

(58) Field of Classification Search
CPC ........ H10N 50/01; H10N 50/10; H10N 50/80; H10B 61/00
See application file for complete search history.

(56) References Cited

U.S. PATENT DOCUMENTS

| | | | |
|---|---|---|---|
| 7,473,951 B2 | 1/2009 | Kim et al. | |
| 8,558,299 B2 | 10/2013 | Cao et al. | |
| 10,580,964 B2 | 3/2020 | Park et al. | |
| 10,636,465 B2 | 4/2020 | Song et al. | |
| 2009/0140303 A1* | 6/2009 | Choi | H01L 23/528 |
| | | | 257/770 |
| 2013/0126996 A1 | 5/2013 | Jeong | |
| 2019/0131516 A1* | 5/2019 | Park | H01L 23/5386 |
| 2020/0013826 A1* | 1/2020 | Reznicek | H10N 50/80 |
| 2021/0043833 A1 | 2/2021 | Lee et al. | |

FOREIGN PATENT DOCUMENTS

JP 5609652 B2 10/2014
KR 10-0552690 B1 2/2006

* cited by examiner

*Primary Examiner* — Su C Kim
(74) *Attorney, Agent, or Firm* — Muir Patent Law, PLLC

(57) ABSTRACT

A method of manufacturing a magnetoresistive random-access memory (MRAM) device includes forming an insulating interlayer on a substrate, forming a contact plug extending through the insulating interlayer, forming a first blocking layer covering an upper surface of the contact plug, the first blocking layer including an amorphous material, forming a lower electrode layer on the first blocking layer, and forming a magnetic tunnel junction structure layer on the lower electrode layer.

20 Claims, 4 Drawing Sheets

METHODS OF MANUFACTURING MAGNETORESISTIVE RANDOM ACCESS MEMORY DEVICE

CROSS-REFERENCE TO RELATED APPLICATION

This application claims priority under 35 U.S.C. § 119 to Korean Patent Application No. 10-2021-0094661, filed on Jul. 20, 2021, in the Korean Intellectual Property Office, the disclosure of which is hereby incorporated by reference in its entirety.

BACKGROUND

1. Field

Example embodiments of the present disclosure relate to methods of manufacturing a semiconductor device. More particularly, example embodiments of the present disclosure relate to methods of manufacturing a magnetoresistive random-access memory (MRAM) device.

2. Description of the Related Art

Recently, as a MRAM device is highly integrated, a size of a magnetic tunnel junction (MTJ) structure may be decreased. Accordingly, the MTJ structure may be easily damaged in a manufacturing process of the MRAM device.

SUMMARY

According to example embodiments, there is a method of manufacturing a MRAM device. The method of manufacturing a MRAM device may include forming an insulating interlayer on a substrate, forming a contact plug extending through the insulating interlayer, forming a first blocking layer covering an upper surface of the contact plug and including an amorphous material, forming a lower electrode layer on the first blocking layer, and forming a MTJ structure layer on the lower electrode layer.

According to example embodiments, there is a method of manufacturing a MRAM device. The method of manufacturing a MRAM device may include forming an insulating interlayer on a substrate, forming a contact plug extending through the insulating interlayer, forming a lower electrode layer on the contact plug, sequentially forming first and second blocking layers on the lower electrode layer and including different amorphous materials, respectively, and forming a MTJ structure layer on the second blocking layer.

According to example embodiments, there is a method of manufacturing a MRAM device. The method of manufacturing a MRAM device may include forming an insulating interlayer on a substrate, forming a contact plug extending through the insulating interlayer and forming a gas including a halogen element in the contact plug when the contact plug is formed, performing a degassing process to remove the gas formed in the contact plug, forming a first blocking layer covering an upper surface of the contact plug and including an amorphous material, forming a lower electrode layer on the first blocking layer, performing CMP process on an upper surface of the lower electrode layer, the CMP process using a solution including hydrogen peroxide, and forming a MTJ structure layer on the lower electrode layer.

BRIEF DESCRIPTION OF THE DRAWINGS

Features will become apparent to those of skill in the art by describing in detail exemplary embodiments with reference to the attached drawings, in which.

DETAILED DESCRIPTION

FIGS. 1 to 5 are cross-sectional views illustrating stages in a method of manufacturing a MRAM device according to example embodiments.

Figure 1:
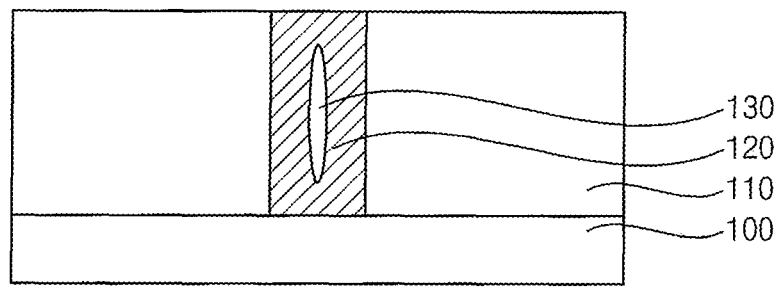
FIGS. 1 to 5 are cross-sectional views illustrating stages in a method of manufacturing a MRAM device according to example embodiments.

Referring to FIG. 1, a first insulating interlayer 110 may be formed on a substrate 100, and a contact plug 120 may be formed to extend through the first insulating interlayer 110. For example, as illustrated in FIG. 1, the contact plug 120 may extend through the entire thickness of the first insulating interlayer 110, e.g., along a direction normal to an upper surface of the substrate 100, to contact the substrate 100, e.g., a lower surface of the contact plug 120 may be directly on the upper surface of the substrate 100.

The substrate 100 may include a semiconductor material, e.g., silicon, germanium, silicon-germanium, or III-V semiconductor compounds, e.g., GaP, GaAs, GaSb, etc. In an example embodiment, the substrate 100 may be a silicon-on-insulator (SOI) substrate or a germanium-on-insulator (GOI) substrate. Various types of elements, e.g., word lines, transistors, diodes, source/drain layers, source lines, wirings, etc., may be formed on the substrate 100, and the contact plug 120 may contact some of the various types of elements and be electrically connected thereto.

The first insulating interlayer 110 may be formed on the substrate 100 to cover the various types of elements. The first insulating interlayer 110 may include an oxide, e.g., silicon oxide.

In example embodiments, the contact plug 120 may be formed by forming an opening to extend through the first insulating interlayer 110 and expose the upper surface of the substrate 100, forming a conductive layer on the substrate 100 and the first insulating interlayer 110 to fill the opening, and planarizing an upper portion of the conductive layer, e.g., via a Chemical Mechanical Polishing (CMP) process, until an upper surface of the first insulating interlayer 110 is exposed. For example, as illustrated in FIG. 1, an upper surface (i.e., opposite the lower surface) of the contact plug 120 may be coplanar with an upper surface of the first insulating interlayer 110.

For example, the conductive layer may be formed by deposition using gas. In detail, the contact plug 120 may be formed using a gas including a metal and a gas including a halogen element, or may be formed using a gas including a metal nitride and a gas including a halogen element. A portion of the gas including the halogen element may remain without reacting with the gas including the metal or the gas including the metal nitride, and thus a gas including the halogen element may be formed in the contact plug 120. Hereinafter, the gas including the halogen element formed in the contact plug 120 may be referred to as a halogen gas 130, e.g., the contact plug 120 may include metal and unreacted halogen gas 130. The conductive layer may include a metal, e.g., tungsten (W), aluminum (Al), titanium (Ti), tantalum (Ta), etc., or a metal nitride, e.g., tungsten nitride (WN), titanium nitride (TiN), tantalum nitride (TaN), etc.

Figure 2:
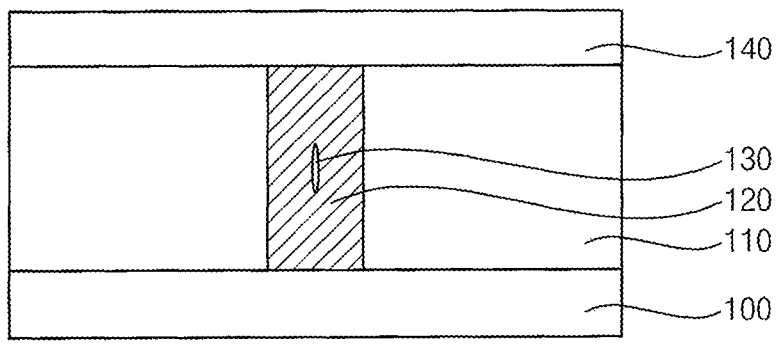

Referring to FIG. 2, a degassing process may be performed to remove the unreacted halogen gas from the contact plug 120, and a first blocking layer 140 may be formed to cover an upper surface of the contact plug 120.

However, the halogen gas 130 may not be completely removed through the degassing process, and thus a portion of the halogen gas 130 may remain in the contact plug 120.

In example embodiments, the degassing process may be performed at a temperature of equal to or higher than about 325° C. and equal to or lower than about 400° C. If the degassing process is performed at a temperature lower than about 325° C., the halogen gas 130 may not be sufficiently removed. If the degassing process is performed at a temperature higher than about 400° C., the various types of elements may be deteriorated. The degassing process may be performed for equal to or more than about an hour.

In example embodiments, the first blocking layer 140 may be formed through e.g., a sputtering process, a physical vapor deposition (PVD) process, a chemical vapor deposition (CVD) process, an atomic layer deposition (ALD) process, etc. For example, the first blocking layer 140 may completely cover the entire upper surface of the contact plug 120, e.g., the first blocking layer 140 may be directly on the upper surface of the contact plug 120.

In example embodiments, the first blocking layer 140 may be formed to have a thickness of equal to or more than about 50 angstroms and equal to or less than about 160 angstroms, e.g., along direction normal to the upper surface of the substrate 100. The first blocking layer 140 may include an amorphous material, e.g., tantalum, tantalum boride (TaB), tantalum nitride (TaN), tantalum boride nitride (TaBN), tantalum carbon fluoroborate (CFBTa), tantalum cobalt iron boride (CoFeBTa) or hafnium oxide ($HfO_2$).

Figure 3:
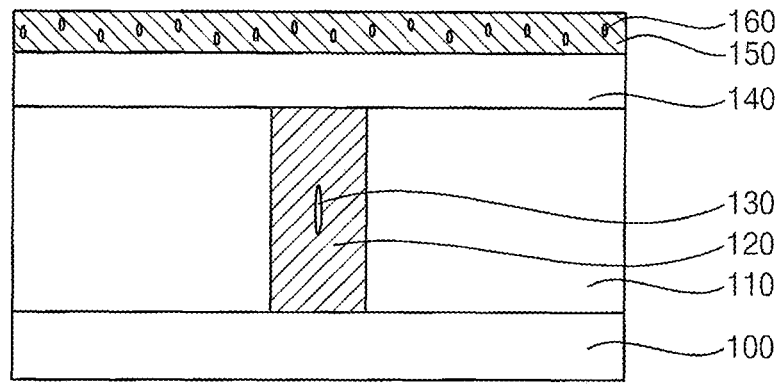

Referring to FIG. 3, a lower electrode layer 150 may be formed on the first blocking layer 140, and an upper surface of the lower electrode layer 150 may be planarized. In example embodiments, the lower electrode layer 150 may be formed through, e.g., a sputtering process, a PVD process, a CVD process, etc. The lower electrode layer 150 may include a metal nitride, e.g., titanium nitride.

In example embodiments, the planarization process may be a CMP process using a solution including hydrogen peroxide ($H_2O_2$), and a portion of the solution including hydrogen peroxide may permeate into the lower electrode layer 150 and remain therein. Hereinafter, the solution including hydrogen peroxide remaining in the lower electrode layer 150 may be referred to as a hydrogen peroxide solution 160.

The first blocking layer 140 may be formed between the contact plug 120 and the lower electrode layer 150, e.g., the first blocking layer 140 may completely separate the contact plug 120 from the lower electrode layer 150. Thus, a diffusion of the halogen gas 130 upwardly in a vertical, e.g., normal, direction perpendicular to the upper surface of the substrate 100 may be blocked, and a flowing of the hydrogen peroxide solution 160 downwardly in the vertical direction may be blocked. That is, the first blocking layer 140 may prevent the halogen gas 130 and the hydrogen peroxide solution 160 from contacting each other, thereby preventing the halogen gas 130 and the hydrogen peroxide solution 160 from reacting to form a strongly reactive gas including hydrogen (H) and a halogen element.

If the first blocking layer 140 is formed to have a thickness of less than about 50 angstroms, the first blocking layer 140 may not sufficiently block the diffusion of the halogen gas 130 and the flowing of the hydrogen peroxide solution 160, so that the halogen gas 130 and the hydrogen peroxide solution 160 may contact and react with each other to form the strongly reactive gas.

Figure 4:
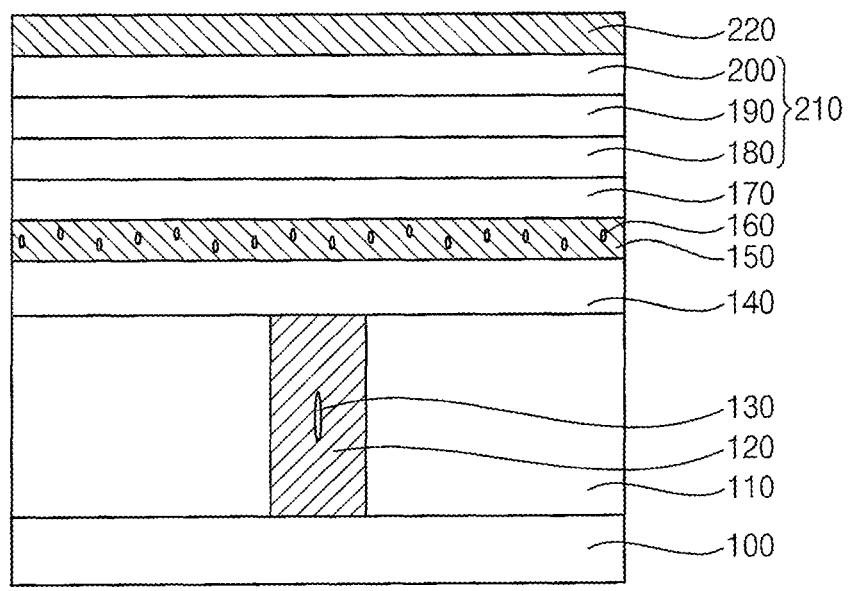

Referring to FIG. 4, a second blocking layer 170, a magnetic tunnel junction (MTJ) structure layer 210, and an upper electrode layer 220 may be sequentially formed on the first blocking layer 140, e.g., on the lower electrode layer 150. In example embodiments, the second blocking layer 170, the MTJ structure layer 210, and the upper electrode layer 220 may be formed through, e.g., a sputtering process, a PVD process, a CVD process, etc.

In example embodiments, the second blocking layer 170 may be formed to have a thickness of equal to or less than about 50 angstroms. The second blocking layer 170 may include an amorphous material, e.g., tantalum, tantalum boride, tantalum nitride, tantalum boride nitride, tantalum carbon fluoroborate, tantalum cobalt iron boride or hafnium oxide.

The MTJ structure layer 210 may include a pinning layer 180, a tunnel barrier layer 190, and a free layer 200 sequentially stacked. For example, the pinning layer 180 may be directly on the second blocking layer 170.

In example embodiments, the pinning layer 180 may include a lower ferromagnetic layer, an anti-ferromagnetic coupling spacer layer, and an upper ferromagnetic layer. The pinning layer 180 may include, e.g., FeMn, IrMn, PtMn, MnO, MnS, MnTe, $MnF_2$, $FeF_2$, $FeCl_2$, FeO, $CoCl_2$, CoO, $NiCl_2$, NiO, and/or Cr. The lower and upper ferromagnetic layers may include, e.g., Fe, Ni, and/or Co. The anti-ferromagnetic coupling spacer layer may include, e.g., Ru, Ir, and/or Rh.

The tunnel barrier layer 190 may include, e.g., aluminum oxide or magnesium oxide, and the free layer 200 may include, e.g., Fe, Ni, and/or Co. The upper electrode layer 220 may include a metal, e.g., titanium or tantalum, and/or a metal nitride, e.g., titanium nitride or tantalum nitride.

Figure 5:
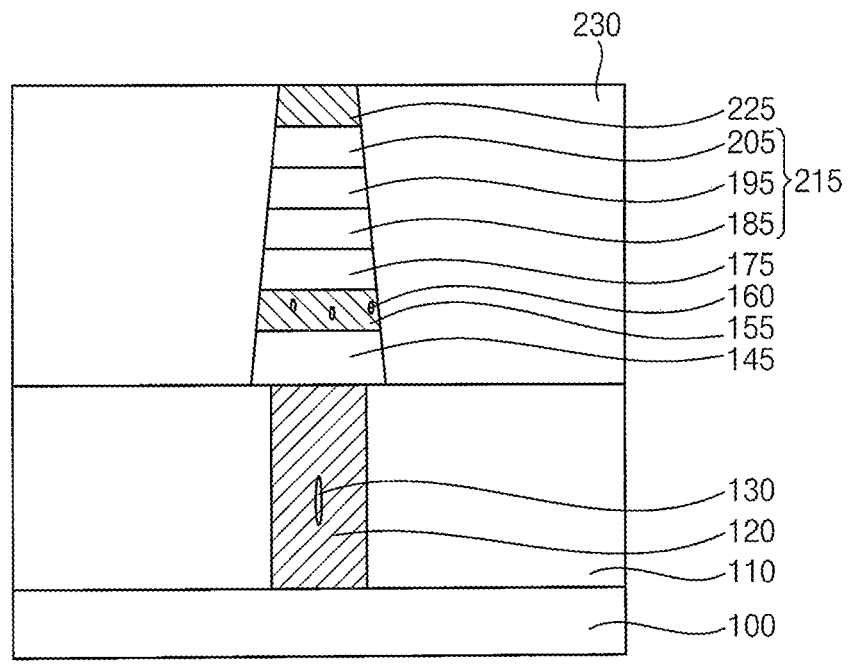

Referring to FIG. 5, the upper electrode 225 may be formed by forming a photoresist pattern on the upper electrode layer 220 (i.e., on the top of the structure of FIG. 4), followed by etching the upper electrode layer 220 using the photoresist pattern as an etch mask. A first blocking pattern 145, a lower electrode 155, a second blocking pattern 175, and an MTJ structure 215 may be sequentially stacked on the contact plug 120 by sequentially etching the MTJ structure layer 210, the second blocking layer 170, the lower electrode layer 150, and the first blocking layer 140 using the upper electrode 225 as an etching mask. The MTJ structure 215 may include a pinning layer pattern 185, a tunnel barrier layer pattern 195, and a free layer pattern 205 sequentially stacked.

In example embodiments, the etching process may be performed through a physical etching process, e.g., an ion beam etching (IBE) process using ions, e.g., argon (Ar) and krypton (Kr).

If the first blocking layer 140 is formed to have a thickness of more than about 160 angstroms, the first blocking layer 140 may not be completely etched during the etching process, and thus the first blocking pattern 145 may not be properly formed. If the second blocking layer 170 is formed to have a thickness of more than about 50 angstroms, an etching byproduct of the second blocking layer 170 may adhere to the MTJ structure 215 during the etching process, and thus magnetic properties of the MTJ structure of 215 may be deteriorated.

A second insulating interlayer 230 may be formed on the substrate 100 to cover the first blocking pattern 145, the lower electrode 155, the second blocking pattern 175, the MTJ structure 215, and the upper electrode 225 so that the fabrication of the MRAM device may be completed. The second insulating interlayer 230 may include an oxide, e.g., silicon oxide.

As described above, before forming the first blocking layer 140, the degassing process may be performed to remove the halogen gas 130 formed in the contact plug 120, however, the halogen gas 130 may not be completely removed therethrough. If the halogen gas 130 and the hydrogen peroxide solution 160 in the lower electrode layer 150 contact each other, the halogen gas 130 and the hydrogen peroxide solution 160 may react with each other to form a strongly reactive gas, which in turn, could diffuse in the vertical direction and contact the MTJ structure 215 to deteriorate the magnetic properties of the MTJ structure 215.

In contrast, in example embodiments, the first blocking layer 140 including an amorphous material may be formed between the contact plug 120 and the lower electrode layer 150, and thus the halogen gas 130 and the hydrogen peroxide solution 160 may not contact each other. Accordingly, the strongly reactive gas may not be formed, and a deterioration of the magnetic properties of the MTJ structure 215 by the strongly reactive gas may be prevented. As a result, a write characteristic of the MRAM device including the first blocking pattern 145 may be improved.

The MRAM device manufactured by the above processes may include the contact plug 120, the first blocking pattern 145, the lower electrode 155, the second blocking pattern 175, the MTJ structure 215, and the upper electrode 225 sequentially stacked on the substrate 100. The MRAM device may further include the first and second insulating interlayers 110 and 230. The MTJ structure 215 may include the pinning layer pattern 185, the tunnel barrier layer pattern 195, and the free layer pattern 205 sequentially stacked.

Figure 6:
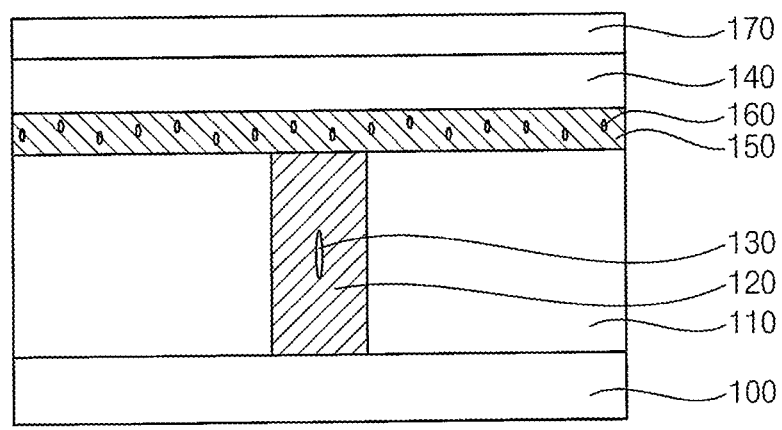
FIGS. 6 and 7 are cross-sectional views illustrating stages in a method of manufacturing a MRAM device according to example embodiments.
Figure 7:
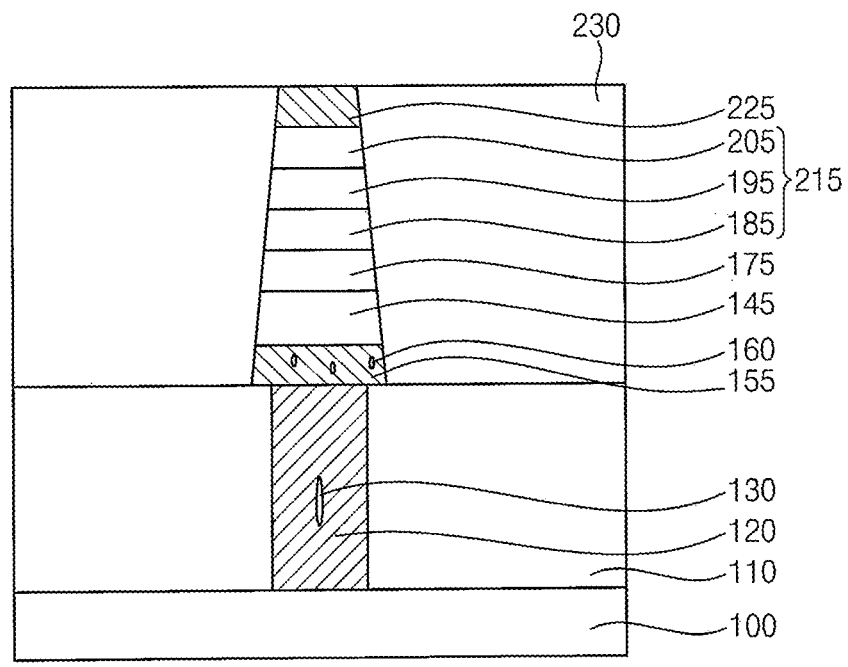

FIGS. 6 and 7 are cross-sectional views of stages in a method of manufacturing a MRAM device according to example embodiments. The method of manufacturing a MRAM in FIGS. 6 and 7 may include processes substantially the same as or similar to the processes described with reference to FIGS. 1 to 5, and thus repeated explanations are omitted herein.

Referring to FIG. 6, the lower electrode layer 150 and the first and second blocking layers 140 and 170 may be sequentially formed on the contact plug 120 and the first insulating interlayer 110. For example, as illustrated in FIG. 6, the first blocking layer 140 may be between the lower electrode layer 150 and the second blocking layer 170. While the halogen gas 130 and the hydrogen peroxide solution 160 may contact and react with each other to form the strongly reactive gas, a diffusion of the strongly reactive gas in a vertical direction may be blocked by the first and second blocking layers 140 and 170. In example embodiments, the first and second blocking layers 140 and 170 may include different amorphous materials, respectively, and thus may not be merged with each other.

Referring to FIG. 7, the MTJ structure layer and the upper electrode layer 220 may be sequentially formed on the second blocking layer 170, and the lower electrode 155, the first and second blocking patterns 145 and 175, and the MTJ structure 215 may be sequentially formed on the contact plug 120 by performing processes substantially the same as or similar to the processes described with reference to FIG. 5. The second insulating interlayer 230 may be formed on the substrate 100 to cover the lower electrode 155, the first and second blocking patterns 145 and 175, the MTJ structure 215, and the upper electrode 225 so that the fabrication of the MRAM device may be completed.

As described above, the diffusion of the strongly reactive gas formed by contacting and reacting the halogen gas 130 and the hydrogen peroxide solution 160 with each other may be blocked by the first and second blocking layers 140 and 170 including an amorphous material, and thus, the magnetic properties of the MTJ structure 215 may not be deteriorated. Accordingly, a write characteristic of the MRAM device including the first and second blocking patterns 145 and 175 may be improved.

The MRAM device manufactured by the above processes may include the contact plug 120, the lower electrode 155, the first and second blocking patterns 145 and 175, the MTJ structure 215, and the upper electrode 225 sequentially stacked on the substrate 100. The MRAM device may further include the first and second insulating interlayers 110 and 230. The MTJ structure 215 may include the pinning layer pattern 185, the tunnel barrier layer pattern 195, and the free layer pattern 205 sequentially stacked.

By way of summation and review, example embodiments provide a method of manufacturing a MRAM device having improved characteristics. That is, in the method of manufacturing a MRAM device, according to example embodiments, a blocking layer may be formed below the MTJ structure, so a deterioration of magnetic properties of the MTJ structure may be prevented, and thus a write characteristic of the MRAM device may be improved Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a magnetoresistive random-access memory (MRAM) device, the method comprising:
    forming an insulating interlayer on a substrate;
    forming a contact plug using a gas including a halogen element, the contact plug extending through the insulating interlayer;
    performing a degassing process to remove a portion of the gas with the halogen element from the contact plug;
    after performing the degassing process, forming a first blocking layer that blocks diffusion of the halogen element from the contact plug, the first blocking layer covering an upper surface of the contact plug and an upper surface of the insulating interlayer, and the first blocking layer including an amorphous material;
    forming a lower electrode layer on the first blocking layer; and
    forming a magnetic tunnel junction structure layer on the lower electrode layer.

2. The method of manufacturing a MRAM device as claimed in claim 1, wherein the degassing process is performed at a temperature of equal to or higher than 325° C. and equal to or lower than 400° C.

3. The method of manufacturing a MRAM device as claimed in claim 1, further comprising performing a planarization process on an upper surface of the lower electrode layer, after forming the lower electrode layer.

4. The method of manufacturing a MRAM device as claimed in claim 3, wherein the planarization process is a chemical mechanical polishing process using a solution including hydrogen peroxide.

5. The method of manufacturing a MRAM device as claimed in claim 1, wherein the first blocking layer includes at least one of tantalum, tantalum boride, tantalum nitride, tantalum boride nitride, tantalum carbon fluoroborate, tantalum cobalt iron boride, and hafnium oxide.

6. The method of manufacturing a MRAM device as claimed in claim 5, wherein a thickness of the first blocking layer is equal to or more than 50 angstroms and is equal to or less than 160 angstroms.

7. The method of manufacturing a MRAM device as claimed in claim 1, further comprising forming a second blocking layer on the lower electrode layer, after forming the lower electrode layer, the second blocking layer including an amorphous material.

8. The method of manufacturing a MRAM device as claimed in claim 7, wherein the second blocking layer includes at least one of tantalum, tantalum boride, tantalum nitride, tantalum boride nitride, tantalum carbon fluoroborate, tantalum cobalt iron boride, and hafnium oxide.

9. The method of manufacturing a MRAM device as claimed in claim 1, further comprising performing a planarization process on the lower electrode layer using hydrogen peroxide, wherein the first blocking layer prevents the halogen element remaining in the contact plug from reacting with the hydrogen peroxide.

10. A method of manufacturing a magnetoresistive random-access memory (MRAM) device, the method comprising:
    forming an insulating interlayer on a substrate;
    forming a contact plug using a gas including a halogen element, the contact plug extending through the insulating interlayer;
    performing a degassing process to remove a portion of the gas with the halogen element from the contact plug;
    after performing the degassing process, forming a lower electrode layer in contact with an upper surface of the contact plug;
    sequentially forming a first blocking layer and a second blocking layer on an upper surface of the lower electrode layer, wherein the first blocking layer and the second blocking layer prevent diffusion of a reactive gas formed from the halogen element remaining in the contact plug after the degassing process, and the first blocking layer and the second blocking layer including different amorphous materials, respectively; and
    forming a magnetic tunnel junction structure layer on the second blocking layer.

11. The method of manufacturing a MRAM device as claimed in claim 10, wherein the degassing process is performed at a temperature of equal to or higher than 325° C. and equal to or lower than 400° C.

12. The method of manufacturing a MRAM device as claimed in claim 10, further comprising performing a planarization process on an upper surface of the lower electrode layer, after forming the lower electrode layer.

13. The method of manufacturing a MRAM device as claimed in claim 12, wherein the planarization process is a chemical mechanical polishing process using a solution including hydrogen peroxide.

14. The method of manufacturing a MRAM device as claimed in claim 10, wherein a thickness of the first blocking layer is equal to or more than 50 angstroms and equal to or less than 160 angstroms.

15. The method of manufacturing a MRAM device as claimed in claim 10, wherein each of the first blocking layer and the second blocking layer includes at least one of tantalum, tantalum boride, tantalum nitride, tantalum boride nitride, tantalum carbon fluoroborate, tantalum cobalt iron boride, and hafnium oxide.

16. The method of manufacturing a MRAM device as claimed in claim 10, further comprising performing a planarization process on the lower electrode layer using hydrogen peroxide, wherein the hydrogen peroxide reacts with the halogen element remaining in the contact plug to form the reactive gas.

17. A method of manufacturing a magnetoresistive random-access memory (MRAM) device, the method comprising:
    forming an insulating interlayer on a substrate;
    forming a contact plug extending through the insulating interlayer, such that the contact plug includes a gas with a halogen element;
    performing a degassing process to remove the gas with the halogen element from the contact plug;
    forming a first blocking layer covering an upper surface of the contact plug, the first blocking layer including an amorphous material;
    forming a lower electrode layer on the first blocking layer;
    performing a chemical mechanical polishing process on an upper surface of the lower electrode layer using a solution including hydrogen peroxide; and
    forming a magnetic tunnel junction structure layer on the lower electrode layer.

18. The method of manufacturing a MRAM device as claimed in claim 17, wherein the degassing process is performed at a temperature of equal to or higher than 325° C. and equal to or lower than 400° C.

19. The method of manufacturing a MRAM device as claimed in claim 17, further comprising forming a second blocking layer on the lower electrode layer, after forming the lower electrode layer, the second blocking layer including an amorphous material.

20. The method of manufacturing a MRAM device as claimed in claim 19, wherein each of the first blocking layer and the second blocking layer includes at least one of tantalum, tantalum boride, tantalum nitride, tantalum boride nitride, tantalum carbon fluoroborate, tantalum cobalt iron boride, and hafnium oxide.

* * * * *